United States Patent
Saxelby et al.

(10) Patent No.: US 6,421,262 B1
(45) Date of Patent: Jul. 16, 2002

(54) ACTIVE RECTIFIER

(75) Inventors: John Saxelby, Maynard; Jay Prager, Tyngsboro; Patrizio Vinciarelli, Boston, all of MA (US); Estia Eichten, Chicago, IL (US)

(73) Assignee: VLT Corporation, San Antonio, TX (US)

( * ) Notice: Subject to any disclaimer, the term of this patent is extended or adjusted under 35 U.S.C. 154(b) by 0 days.

(21) Appl. No.: 09/499,822

(22) Filed: Feb. 8, 2000

(51) Int. Cl.[7] .......................... H02M 3/335; H02M 7/217
(52) U.S. Cl. .................. 363/127; 363/21.14; 363/21.06
(58) Field of Search ........................... 363/21.06, 21.14, 363/125, 127, 89

(56) References Cited

U.S. PATENT DOCUMENTS

| | | | |
|---|---|---|---|
| 3,663,941 A | 5/1972 | Pasciutti ........................ 321/2 |
| 4,205,369 A | 5/1980 | Asano .......................... 363/62 |
| 4,399,499 A * | 8/1983 | Butcher et al. ................ 363/17 |
| 4,451,743 A | 5/1984 | Suzuki et al. ................. 307/110 |
| 4,716,514 A | 12/1987 | Patel ........................... 363/127 |
| 4,733,159 A | 3/1988 | Edwards et al. ............. 323/282 |
| 4,870,555 A | 9/1989 | White .......................... 363/21 |
| 4,994,886 A | 2/1991 | Nadd ........................... 357/41 |
| 5,043,859 A | 8/1991 | Korman et al. .............. 363/147 |
| 5,414,614 A | 5/1995 | Fette et al. .................... 363/59 |
| 5,457,624 A | 10/1995 | Hastings ....................... 363/127 |
| 5,523,940 A | 6/1996 | Wymelenberg ............. 363/127 |
| 5,544,038 A | 8/1996 | Fisher et al. ................. 363/147 |
| 5,563,779 A | 10/1996 | Cave et al. .................... 363/59 |
| 5,590,032 A * | 12/1996 | Bowman ...................... 363/15 |
| 5,659,460 A | 8/1997 | Vinciarelli .................... 363/21 |
| 5,663,877 A * | 9/1997 | Dittli et al. .................. 363/127 |
| 5,708,571 A | 1/1998 | Shinada ........................ 363/16 |
| 5,721,483 A | 2/1998 | Kolluri et al. ............... 323/224 |
| 5,726,869 A | 3/1998 | Yamashita et al. ............ 363/21 |
| 5,744,994 A * | 4/1998 | Williams ...................... 327/374 |
| 5,818,704 A | 10/1998 | Martinez ...................... 363/21 |
| 5,929,690 A * | 7/1999 | Williams ...................... 327/374 |
| 5,978,283 A | 11/1999 | Hsu et al. .................. 365/189.09 |
| 5,986,947 A | 11/1999 | Choi et al. ............. 365/189.11 |
| 5,991,171 A * | 11/1999 | Cheng ....................... 363/21.06 |
| 5,991,182 A | 11/1999 | Novac et al. ................ 363/126 |
| 6,002,597 A | 12/1999 | Rozman ....................... 363/21 |
| 6,069,799 A * | 5/2000 | Bowman ...................... 363/20 |
| 6,151,233 A * | 11/2000 | Kondo ......................... 363/125 |
| 6,188,592 B1 * | 2/2001 | Farrington et al. ............ 363/98 |
| 6,256,214 B1 * | 7/2001 | Farrington et al. ......... 363/127 |

OTHER PUBLICATIONS

Sherman et al., "Synchronous Rectification: Improving The Efficiency of Buck Converters", EDN, Mar. 14, 1996, pp. 111–118.

Fairchild Semiconductor Corporation, brochure featuring FDP6670AL/FDB6670AL N–Channel Logic Level Power-Trench MOSFET, Jul., 1998.

MAXIM brochure, Switched–Capacitor Voltage Converters, 19–4667; Rev 1: 7/94.

Bindra, "Optimized Synchronous Rectification Drives UP DC–DC Efficiency", Electronic Design, Jan. 24, 2000, pp. 58–66.

Edgar Abdoulin et al., "A Novel Integrated Controller For Synchronous Rectifiers Boosts Supply Efficiency".

* cited by examiner

*Primary Examiner*—Bao Q. Vu
(74) *Attorney, Agent, or Firm*—Fish & Richardson P.C.

(57) ABSTRACT

A switching circuit has an active switch, a controller, and at least two terminals. The at least two terminals include two current control terminals for connection at two locations in another circuit. The controller is configured to turn the active switch off to block current between the two locations when the voltage between the two locations is of a first polarity and otherwise to turn the active switch on to conduct current between the two locations, whether or not the two current control terminals are the only ones of the at least two terminals that are connected to the other circuit.

17 Claims, 18 Drawing Sheets

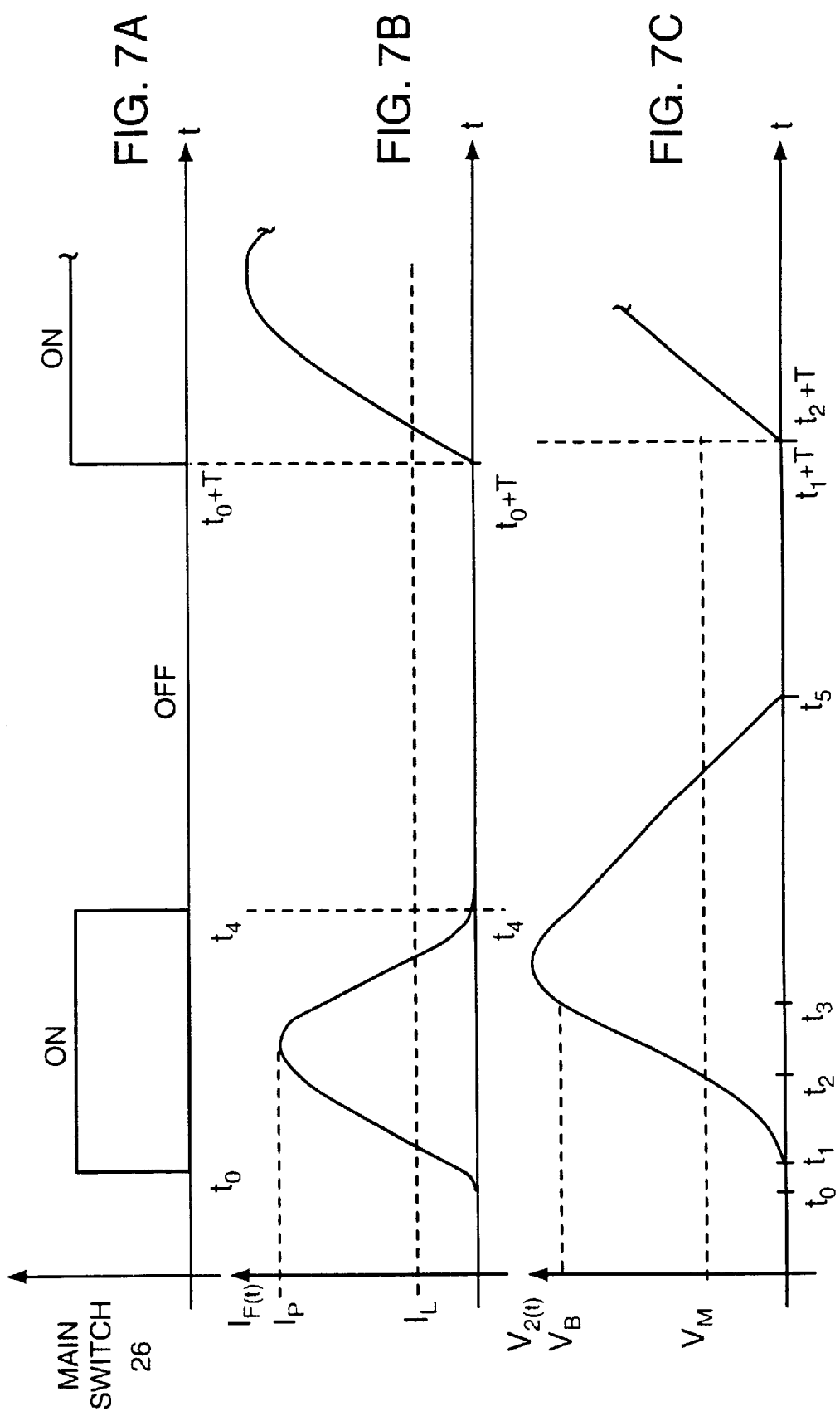

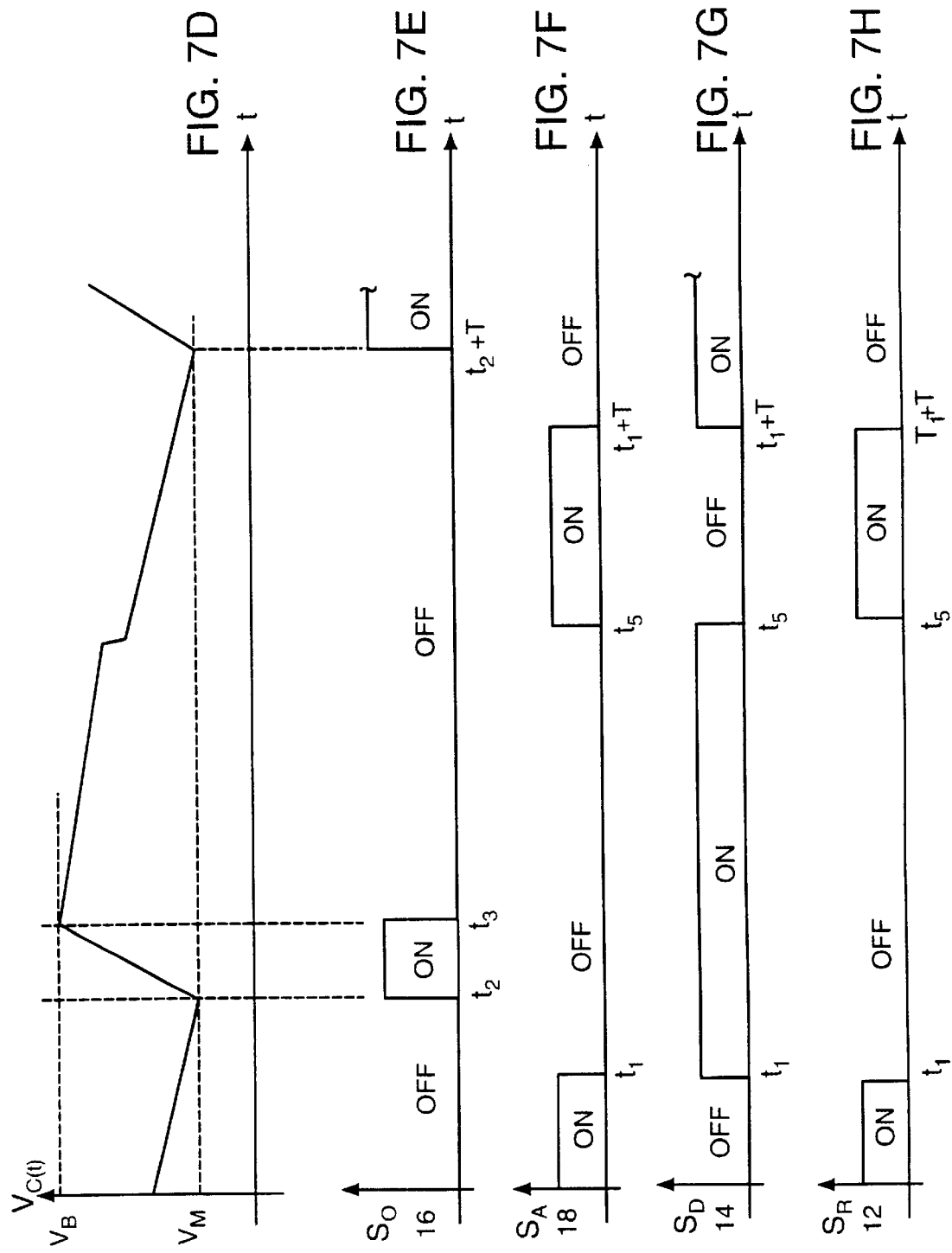

ACTIVE RECTIFIER

This invention relates to controlled active switching.

As illustrated in FIG. 1, an ideal rectifier diode 1 is a two terminal device which conducts current, $I_R$, of one polarity with essentially no loss (i.e., with no voltage drop, $V_R$, across the rectifier) and which blocks current (and voltage) of the opposite polarity. In practice, rectifiers exhibit a forward voltage drop, $V_R=V_F$, when carrying current and conduct some reverse "leakage" current when blocking. The forward voltage drop results in power loss when the rectifier is conducting current.

The power loss associated with rectifier forward voltage drop in power supplies can be a significant source of loss. For example, FIG. 2 shows a schematic of a pulse-width-modulated ("PWM") switching power supply 1 in which one or more switches (e.g., switches 3) are opened and closed to effect a transfer of energy from an input source 2 to a current-sinking load (as modeled by current source 7). The switching power supply may include one or more transformers 4 to provide isolation and voltage multiplication. In general, a pulsating voltage waveform, Vs(t), is delivered to the anode of forward rectifier 5. The forward rectifier 5 conducts current $I_F$ during some or all of the time that voltage Vs is positive (depending on the specific converter topology) and blocks during the remainder of the converter operating cycle. A "freewheeling" rectifier 6 conducts current $I_S$ during the time that the forward rectifier 5 is blocking and blocks when the forward rectifier is conducting. Since each of the rectifiers conducts current during a portion of each operating cycle, power is dissipated in the rectifiers 5,6 throughout the entire operating cycle. Furthermore, since the average value of $I_L$ must be equal to the sum of the average values of $I_F$ and $I_S$, and making the assumption that both of the rectifiers 5,6 have an essentially constant forward voltage drop, $V_F$, when conducting, the forward loss in the rectifiers will be approximately equal to $P_{FL}=V_F*I_L$, where $I_L$ is the average value of the load current. If the average value of the voltage across the load 7 is $V_O$, then the power delivered to the load equals $P_{OUT}=V_O*I_L$. Thus, the loss in conversion efficiency owing solely to conduction losses in the rectifier diodes is approximately equal to: Rectifier Loss=$100\%*(P_{FL}/P_{OUT})=100\%*(V_F/V_O)$.

The rectifier loss increases as the ratio of $V_F$ to $V_O$ increases. For example, if bipolar junction diode rectifiers (for which $V_F$ is approximately 0.7 volt) are used in a power supply having a 24 volt output they will result in a rectifier loss of approximately $100*(0.7/24)=2.9\%$. On the other hand, use of such diodes in a power supply delivering 3.3 volts would result in a rectifier loss of 21.2%. Using Schottky rectifiers (for which $V_F$ is approximately 0.4 volt) in the 3.3 volt power supply would result in a rectifier loss of 12.1%. In either instance, the amount of power dissipated in the rectifiers is substantial. In addition to conduction losses, rectifiers also exhibit switching losses associated with flow of reverse recovery currents during switching transitions. This can be particularly significant in bipolar junction diode rectifiers.

One way to reduce the efficiency loss, illustrated in FIGS. 3 and 4, is to use active switching devices, such as bipolar transistors 5a,6a or MOSFETs 5b,6b, in place of rectifier diodes. The forward switches 5a,5b are controlled to turn on during a forward conduction interval and to turn off during a blocking interval; the freewheeling switches 6a,6b are controlled to turn off during the forward conduction interval and to turn on during the blocking interval. Bipolar transistors can exhibit forward saturation voltage drops which are lower than the forward voltage drop of contemporary junction or Schottky diodes. MOSFETs with channel resistances of a few milliohms are also currently available. Thus, active switching devices can exhibit lower voltage drops, and rectification losses, than rectifier diodes used alone. In certain applications both of the rectifiers 5,6, FIG. 2, are replaced with active switching devices; in other applications only one of the rectifiers is replaced (depending on the relative average values of $I_F$ and $I_S$); in yet other applications, rectifier diodes (e.g., diodes 5,6, FIG. 2) are bypassed with an active switching device. The process of controlling active switching devices to perform rectification is called "synchronous rectification." Examples of synchronous rectification circuits are shown in Wymlenberg, U.S. Pat. No. 5,523,940; Martinez, U.S. Pat. No. 5,818,704; Rozman, U.S. Pat. No. 6,002,597; Yamashita, U.S. Pat. No. 5,726,869; Pasciutti, U.S. Pat. No. 3,663,941; Novac, U.S. Pat. No. 5,991,182; White, U.S. Pat. No. 4,870,555; Kolluri, U.S. Pat. No. 5,721,483; Shinada, U.S. Pat. No. 5,708,571; and in Patel, U.S. Pat. No. 4,716,514.

SUMMARY

In general, in one aspect, the invention features a switching circuit having an active switch, a controller, and at least two terminals. The at least two terminals include two current control terminals for connection at two locations in another circuit. The controller is configured to turn the active switch off to block current between the two locations when the voltage between the two locations is of a first polarity and otherwise to turn the active switch on to conduct current between the two locations, whether or not the two current control terminals are the only ones of the at least two terminals that are connected to the other circuit.

Implementations of the invention may include one or more of the following features. There are exactly two terminals. The active switch includes a parallel diode. The active switch is a MOSFET. A bias subcircuit is configured to use power from the other circuit to provide a bias operating power to the switching circuit. The bias subcircuit includes a capacitor, a switch, and a bias voltage controller for the switch. The other circuit includes a power converter. The controller is configured to sense a polarity of the voltage between the two locations and to turn the active switch on and off in response to the sensed polarity.

In general, in another aspect, the invention features a method in which an active switch is turned off to block current between two locations in a circuit when the voltage between the two locations is of a first polarity and otherwise is turned on to conduct current between the two locations, without regard to voltages or currents at any other locations in the circuit.

In general, in another aspect, the invention features a method in which an end of each of two conductive sheets is attached to a respective one of at least two current carrying terminations of a semiconductor die. Another end of each of said two conductive sheets is attached to a respective one of two generally flat connection surfaces of a circuit component so that said switching element is in close proximity to an outer surface of said circuit component.

In general in another aspect the invention features apparatus having two conductive sheets, an end of each of the conductive sheets being attached to a respective one of at least two current carrying terminations of a semiconductor die. Another end of each of the conductive sheets is attached to a respective one of two generally flat connection surfaces of a circuit component, the connections being arranged so that the switching element is in close proximity to an outer surface of the circuit component.

Implementations of the invention may include one or more of the following features. The circuit component includes a capacitor of a power converter and the apparatus includes a two-terminal synchronous rectifier. The semiconductor die has circuitry for controlling the conductivity state of a MOSFET that is part of the die. The semiconductor die also has bias circuitry for generating a source of bias voltage.

In general, in another aspect, the invention features apparatus having a substrate and a semiconductor die that includes a controlled switching element and current carrying terminations. A conductive sheet has an end connected to a surface of the substrate and to one of the current-carrying terminations. A conductive strap has an end connected to another of the current-carrying terminations. Control circuitry controls a conductivity state of the switching element. Bias circuitry is configured to use power from the other circuit to provide operating power to the switching circuit.

Implementations of the invention may include one or more of the following features. The bias circuitry includes a storage capacitor. The control circuitry, the storage capacitor, and the bias circuitry are mounted to a surface of the substrate. The control circuitry and the bias circuitry are mounted to a surface of the substrate other than the surface to which the conductive sheet is connected. The semiconductor die includes the control circuitry and the bias circuitry. The current-carrying terminations lie on opposite parallel surfaces of the die. The end of the conductive strap is arranged in parallel with the opposite parallel surfaces and with the surface of the substrate. The apparatus includes multiple switching elements and the number of switching elements which are turned on is determined by the control circuitry based upon an amount of current being conducted. The switching devices are MOSFETs and the control circuitry makes the determination by measuring a voltage across the two locations when the controlled switches are turned on.

Other advantages and features will become apparent from the following description and from the claims.

DESCRIPTION

We first describe the Figures.

FIGS. 7A–7H show waveforms for the converter of FIG. 6.

Figure 4:
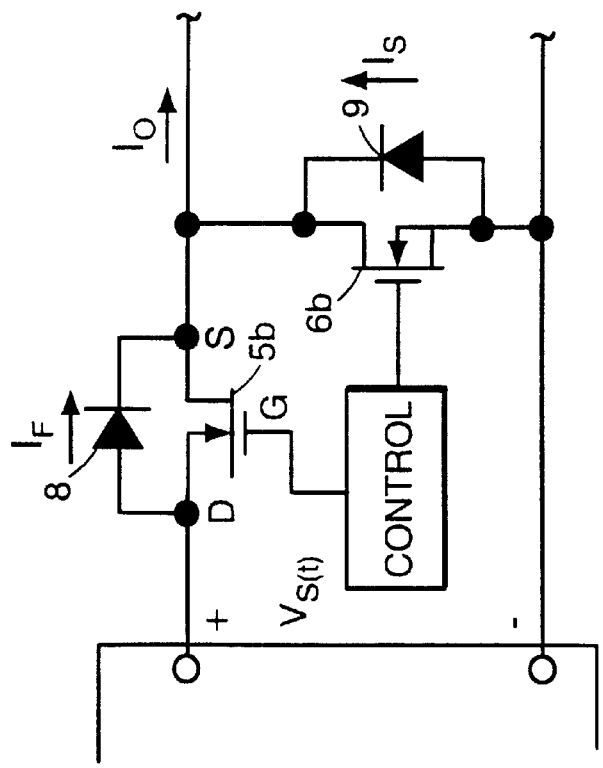
FIGS. 3 and 4 show active switching devices used as rectifiers.
Figure 3:
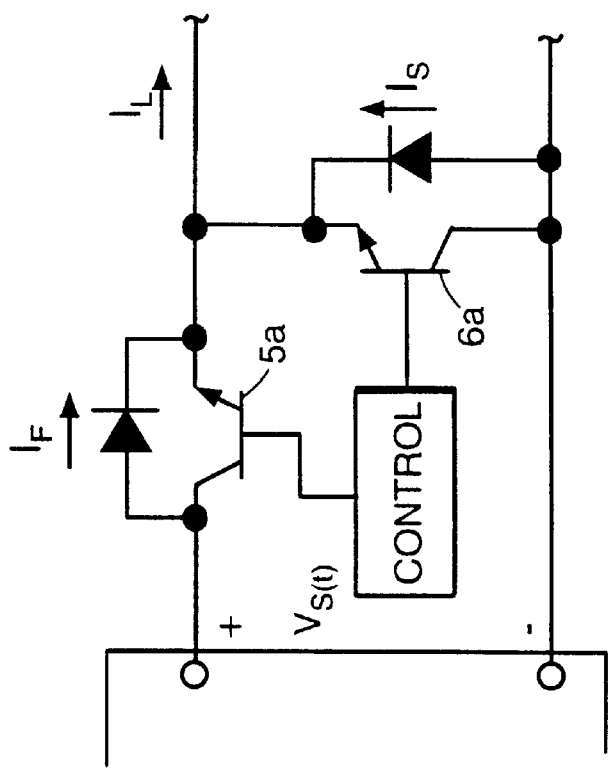

Synchronous rectification in switching power supplies involves use of an active switching device, such as a MOSFET transistor, which is controlled in its on state to have a lower voltage drop than an ordinary rectifier diode. In general an active switching device is a three-terminal device in which the conductivity between two of the terminals is controlled by a signal applied to third. Achieving synchronous rectification with MOSFET switches requires that the switch be driven on and off at appropriate times; that the switch transitions be free of parasitic ringing; and that sufficient bias voltage be available to turn on the MOSFET. In some prior art techniques, transformer windings are used to drive the MOSFET switches on and off. This technique can create timing and parasitic ringing problems owing to leakage inductances in the winding. It also assumes that the on and off transitions of the synchronous switch correspond in time to the rise and fall of the voltage in the secondary winding—an assumption which is not true in all converter topologies (e.g., certain resonant and zero-current switching topologies). Finally, the transformer used in the converter must be customized for the particular MOSFET being used. Other prior art techniques adapt some other signal (e.g., a signal used to drive power conversion switches) into a form suitable for driving a synchronous MOSFET switch. This technique also requires that the on and off transitions of the selected signal correspond in time to on and off times of the synchronous switch; is particularly prone to timing errors which cause losses (e.g., with reference to FIG. 4, due to current flowing for a period of time in rectifiers 8 or 9; due to conduction overlap in the switches 5b,6b; or due to one or the other of the switches remaining on too long and carrying reverse current); usually requires a separate source of voltage for driving the gates of the synchronous MOSFET switch; and often requires complex level-shifting circuitry. Other prior art techniques use a phase locked loop to adjust (i.e., a phase adjusting "servo") the timing of the signals used to drive the synchronous switches relative to signals at transformer windings. Besides being complex and requiring a source of voltage for driving the gates of the synchronous MOSFET switch, this technique is optimum only under steady-state operation; increased circuit losses will occur whenever the duty cycle of the converter changes.

Figure 5:
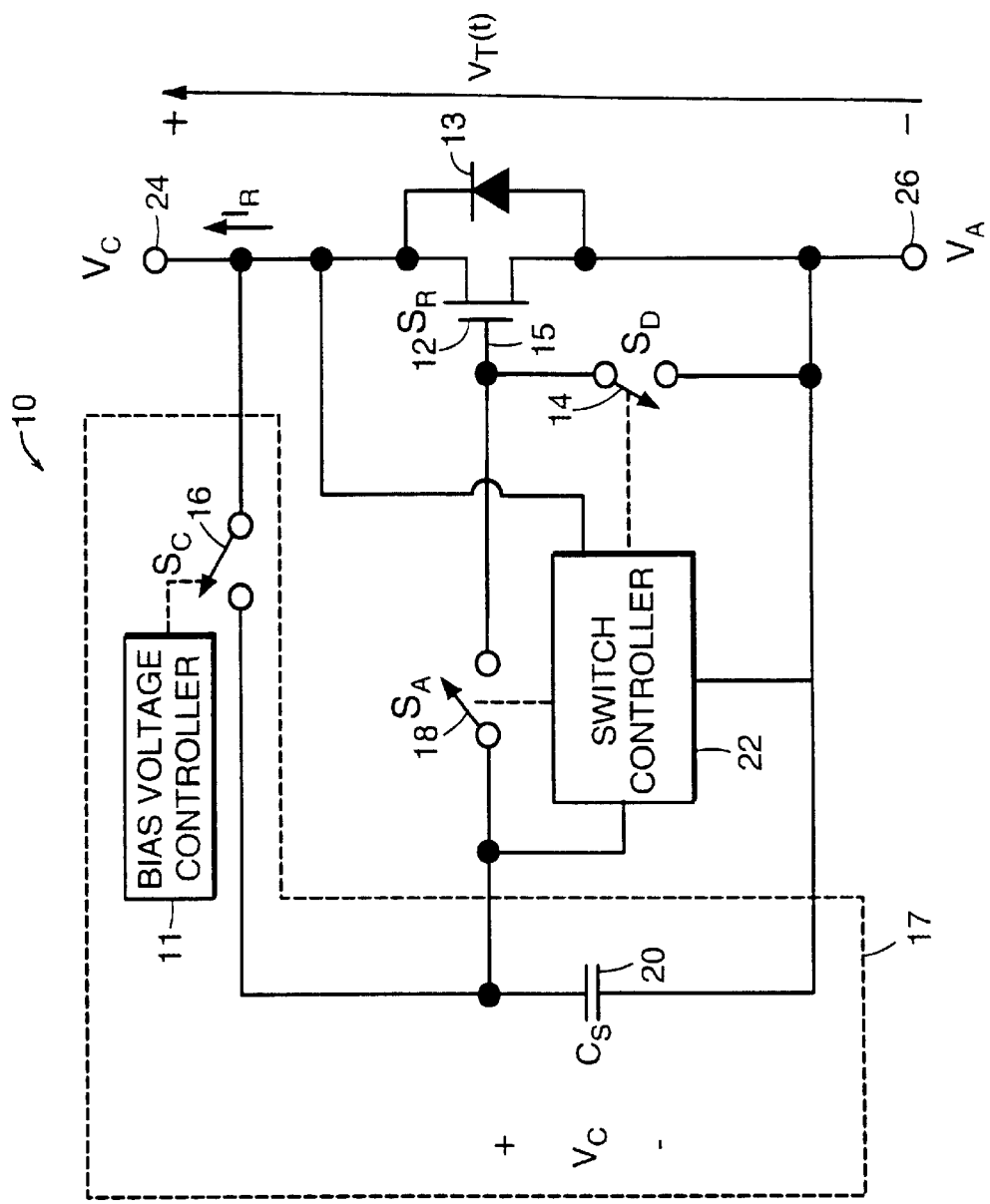
FIG. 5 shows a two-terminal synchronous rectifier according to the invention.

FIG. 5 shows a two-terminal synchronous rectifier 10 according to the invention. The synchronous rectifier comprises a voltage controlled switch 12 (labeled $S_R$); a discharge switch 14 (labeled $S_D$); an activation switch 18 (labeled $S_A$); a bias circuit 17 comprising a bias voltage controller 11 and a charging switch 16 (labeled $S_C$) and storage capacitor 20 (labeled $C_S$); and a synchronous switch controller 22. The synchronous rectifier 10 is a two terminal device: the cathode of the synchronous rectifier is terminal 24 and the anode of the synchronous rectifier is terminal 26. The synchronous switch controller 22 will control the switches so that switch 12 is conductive when the voltage, $V_T$, between terminals 26 and 24 is negative and will control the switches so that switch 12 is non-conductive when $V_T$ is positive. Bias voltage for the switch controller is generated within the two-terminal synchronous rectifier 10 by the bias circuit 17.

In preferred embodiments of the invention, switch 12 is a depletion mode MOSFET switch. The MOSFET is selected so that it exhibits a maximum voltage drop, $V_{TMAX}$, when its channel is turned fully on, which is below some predetermined limit over some desired operating range of the current $I_R$. For example, if the current $I_R$ ranges up to 20 amperes, and the desired maximum value of voltage drop is 0.2 volts, then the MOSFET would be selected to have an on-resistance below 0.01 ohms (10 milliohms). MOSFET switches of this type may comprise a parasitic diode (shown as diode 13 in FIG. 5) intrinsic to the device. It is axiomatic, for circuit efficiency reasons alone, that the maximum voltage drop in the channel of the MOSFET, $V_{TMAX}$, be selected to be sufficiently below the forward voltage drop of the intrinsic diode 13 so that the diode is prevented from conducting significant current (which also prevents the forward and reverse recovery characteristics of the diode 13 from affecting circuit performance).

Figure 6:
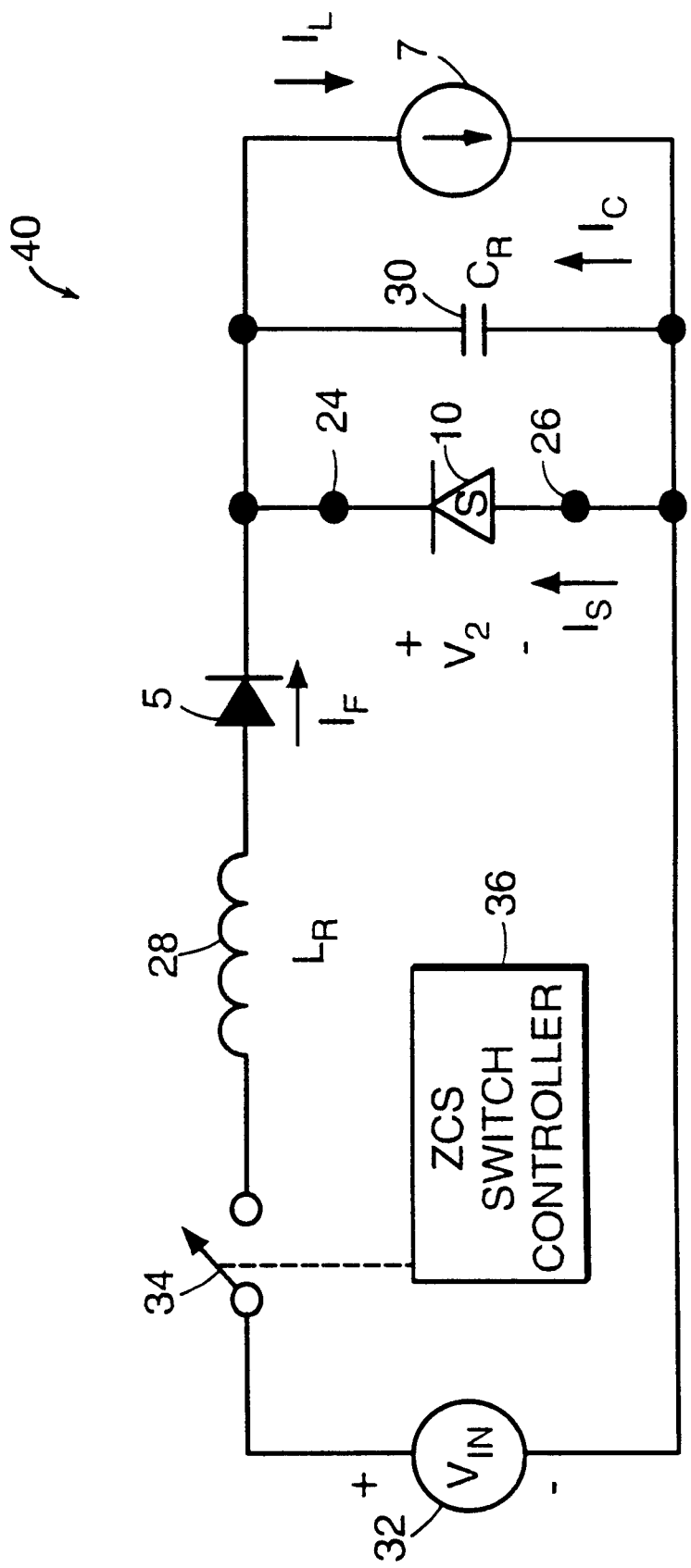
FIG. 6 is an equivalent circuit schematic of a ZCS power converter.
Figure 8A:
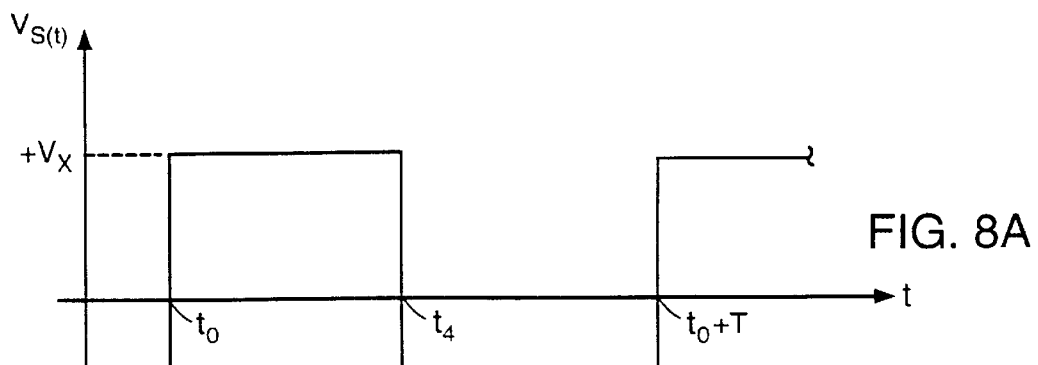
FIGS. 8A–8D show waveforms for another power converter.
Figure 8B:
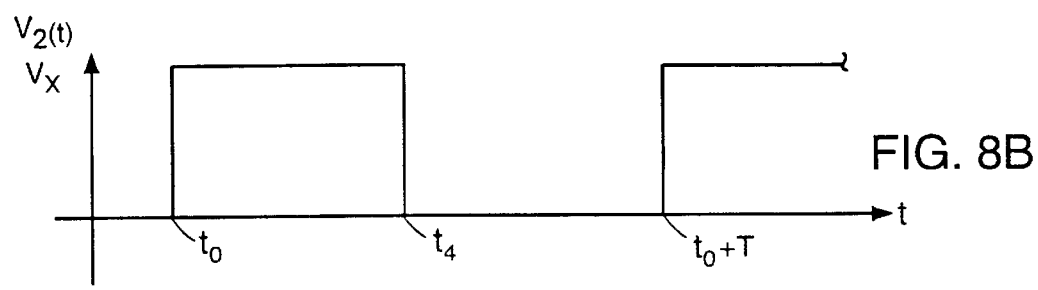
Figure 8C:
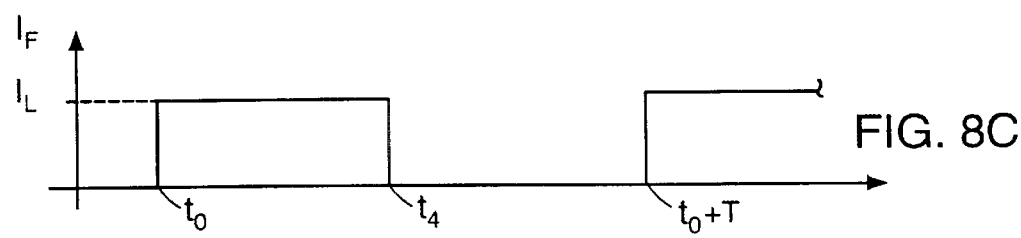
Figure 8D:
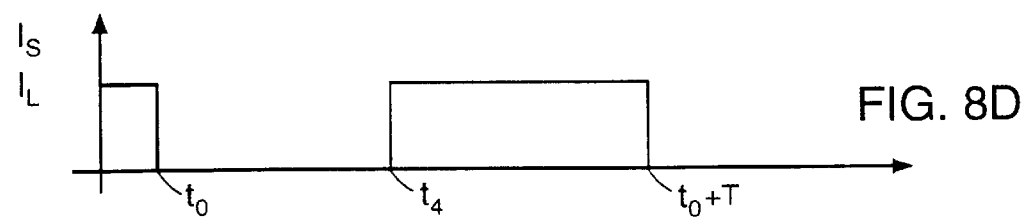

Operation of the two-terminal synchronous rectifier 10 as a freewheeling diode in a zero-current switching ("ZCS") converter is described with reference to FIGS. 5, 6 and 7. In FIG. 6, the non-isolated equivalent circuit of a ZCS forward converter 40 includes the two-terminal synchronous rectifier 10 of FIG. 5 (including cathode and anode terminals 26,24), an inductance $L_R$ 28, a capacitance $C_R$ 30, a forward rectifier 28, an input source 32, a main switch 34, a ZCS switch controller 36 and a current sinking load, of value $I_R$, represented by current source 7. Operation of a ZCS forward converter is described in Vinciarelli, U.S. Pat. No. 4,415,959, incorporated herein by reference (the "'959 patent"). As explained in '959 patent, the inductance $L_R$ and capacitance $C_R$ set a characteristic time constant $T_C$=pi*sqrt($L_R*C_R$) for the rise and fall of the currents in the converter. Current source 7 is an idealized model of an output filter inductor in a real converter. FIG. 7 shows waveforms for the converter of FIG. 6. As used herein, with respect to the conduction state of a switch, the term "on" shall mean that the switch is enabled to conduct current and the term "off" shall mean that the switch is not enabled to conduct current.

With reference to FIGS. 5, 6 and 7, at a time just prior to time $t_0$ the main switch 34 is off and current $I_F$ is zero; capacitor $C_S$ is charged to a bias voltage $V_C$ which, when applied to the voltage control input 15 of the voltage controlled switch 12, is sufficient to turn the voltage controlled switch 12 on with a forward voltage drop ($V_R$, FIG. 5) below some predetermined small value; the charging and discharge switches 16,14 are off and activation switch 18 is on; voltage $V_C$ is applied to voltage control input 15, the voltage controlled switch 12 is on and, assuming that the voltage drop in switch 12 is small, $V_2$ is essentially zero, $I_C$ is essentially zero and the current $I_S$ flowing in two-terminal synchronous rectifier 10 (via switch 12) is essentially equal to the load current $I_L$. At time $t_0$ the ZCS switch controller turns switch 34 on (FIG. 7A) and current $I_F$ begins to flow (FIG. 7B). Between times $t_0$ and $t_1$ the current $I_F$ is increasing towards a value $I_L$ and the current $I_S$ is declining toward zero. Following time $t_1$ the current $I_S$ reverses as does the polarity of the (small) voltage, $V_2$, across terminals 24, 26 of the two-terminal synchronous rectifier 10. The polarity reversal in $V_2$ is promptly sensed by synchronous switch controller 22, which, as shown in FIGS. 7F and 7G, rapidly turns the activation switch 18 off and the discharge switch 14 on. This removes voltage from the voltage control input 15 of switch 12, turning it off (FIG. 7H). As a result, at time $t_1$, the two-terminal synchronous switch is turned off.

Between time $t_1$ and $t_4$ the current $I_F$ (FIG. 7B) and the voltage $V_2$ (FIG. 7C) rise and fall with a characteristic time constant $T_C$, as explained in the 959 patent. At time $t_4$ the current, $I_F$, returns to zero and the ZCS switch controller turns the main switch 34 off. Between time $t_4$ and time $t_5$ the current $I_F$ is zero and the entire load current, $I_L$, flows in the capacitor 30, discharging it toward zero voltage, as shown in FIG. 7C. Following time $t_5$ the flow of current $I_L$ in capacitor $C_R$ 30 will cause the voltage, $V_2$, across the capacitor to reverse. This polarity reversal in $V_2$ is promptly sensed by synchronous switch controller 22, which, as shown in FIGS. 7F and 7G, rapidly turns the activation switch 18 on and the discharge switch 14 off. This supplies voltage to the voltage control input 15 of switch 12, turning it on (FIG. 7H). As a result, at time $t_5$, the two-terminal synchronous switch is turned on. The load current $I_L$ flows in the two-terminal synchronous switch until time $t_1$+T, at which time the cycle repeats as described above (T is the operating period of the converter 40).

The bias voltage controller 11 controls the bias voltage, $V_C$, across capacitor $C_S$ by controlling the timing of the charging switch 16 in the bias circuit 17. FIG. 7D shows the bias voltage during the operating cycle. Between times $t_3$ and $t_2$+T energy is supplied by capacitor $C_S$ 20 to the synchronous switch controller and the bias voltage is shown to be declining as the capacitor discharges (the decline being purposely exaggerated for illustrative purposes). During the operating cycle, energy is also supplied by capacitor $C_S$ to the inputs of switches. For example, if the voltage controlled switch 12 is a MOSFET, then energy is supplied at time $t_5$, via activation switch 18, to the capacitive voltage control input 15 of the MOSFET, resulting in a step decline in voltage $V_C$ at that time (FIG. 7D). To replenish capacitor $C_S$, the bias voltage controller 17 monitors the voltage, $V_2$, across the two-terminal synchronous switch 10 during the time that the voltage controlled switch is off. When, at time $t_2$, the increasing value of $V_2$ (FIG. 7C) equals the declining value of $V_C$ (FIG. 7D), the bias voltage controller 11 turns on charging switch 16 (FIG. 7E), connecting capacitor $C_S$ in parallel with capacitor $C_R$ and causing the voltage $V_C$ to follow the increasing value of the voltage $V_2$. At time $t_3$, when voltage $V_C$ reaches a predetermined value $V_B$, the bias voltage controller 11 turns charging switch 16 off (FIG. 7E). The value $V_B$ is selected based on the specified voltage rating of the voltage control input 15 of the voltage controlled switch 12. For example, in a particular converter the peak value of the voltage $V_2$(t) might be 50 volts, the maximum allowable gate drive voltage of a MOSFET voltage controlled switch 12 might be 15 volts and the minimum gate voltage required to reduce the MOSFET on-resistance to a level sufficient to meet some predetermined value of voltage drop might be 7 volts. In such a converter, $V_B$ would be set to be below 15 volts and the capacitor $C_R$ would be sized to ensure that the minimum gate voltage Vm (FIG. 7D) during the operating cycle stayed above 7 volts.

Because the two-terminal synchronous rectifier 10 generates its own internal bias voltage for powering the switch controller 22 and driving the control input of a voltage controlled switch, it can be connected into a circuit in essentially the same manner as an ordinary diode. This overcomes the drawbacks associated with prior art schemes which require an external bias source and/or in which external synchronization signals must be delivered to the switch controller.

Figure 1:
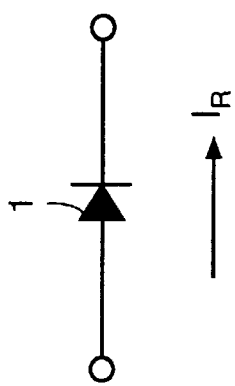
FIG. 1 shows a rectifier diode.
Figure 2:
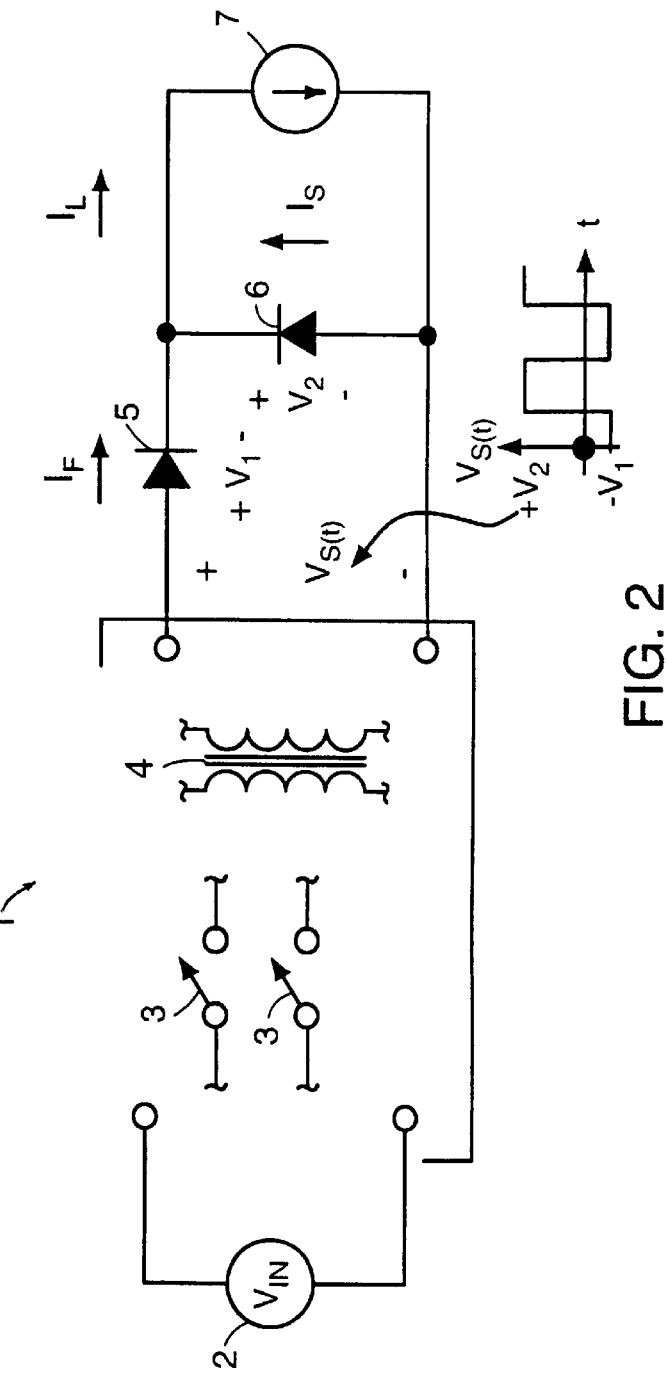
FIG. 2 shows a switching power converter circuit.
Figure 9A:
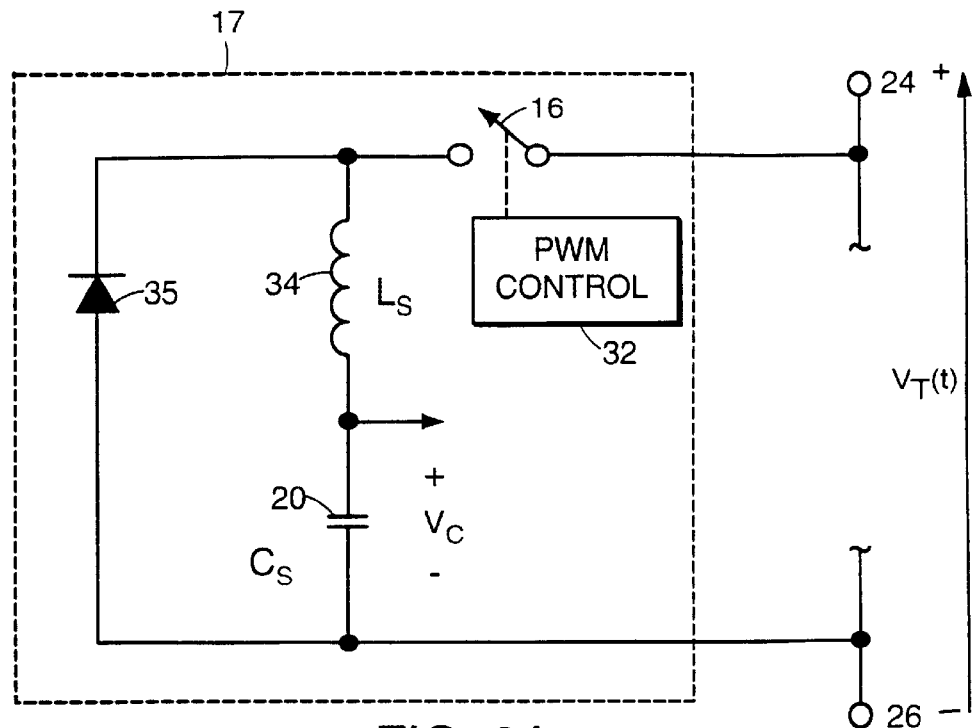
FIGS. 9A–9C show bias circuits.
Figure 9B:
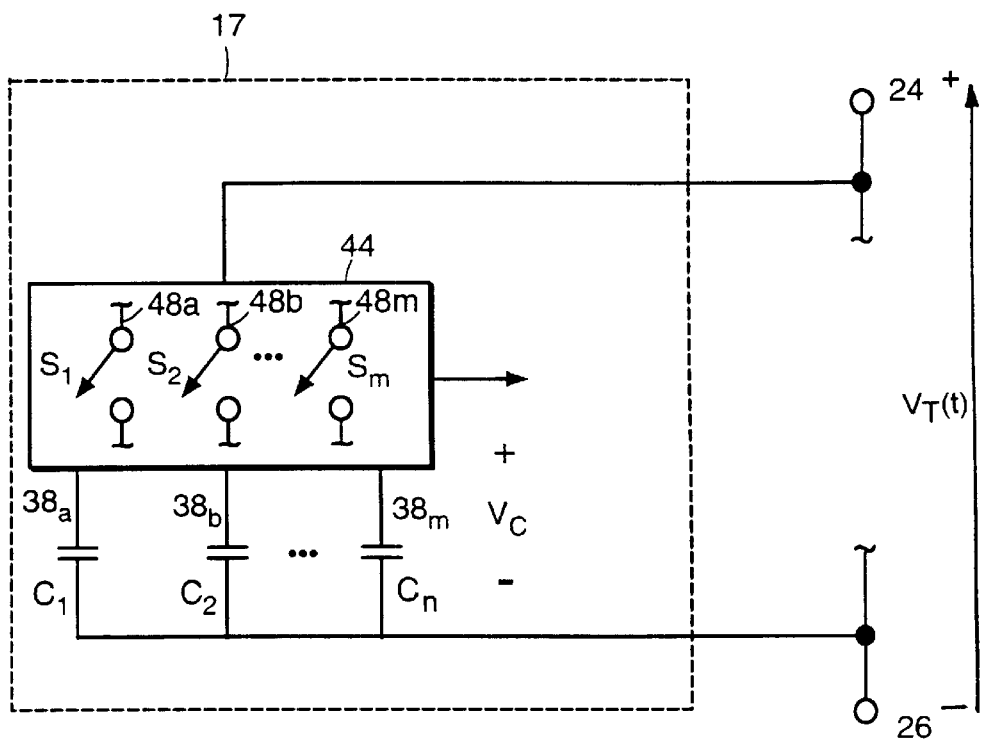
Figure 9C:
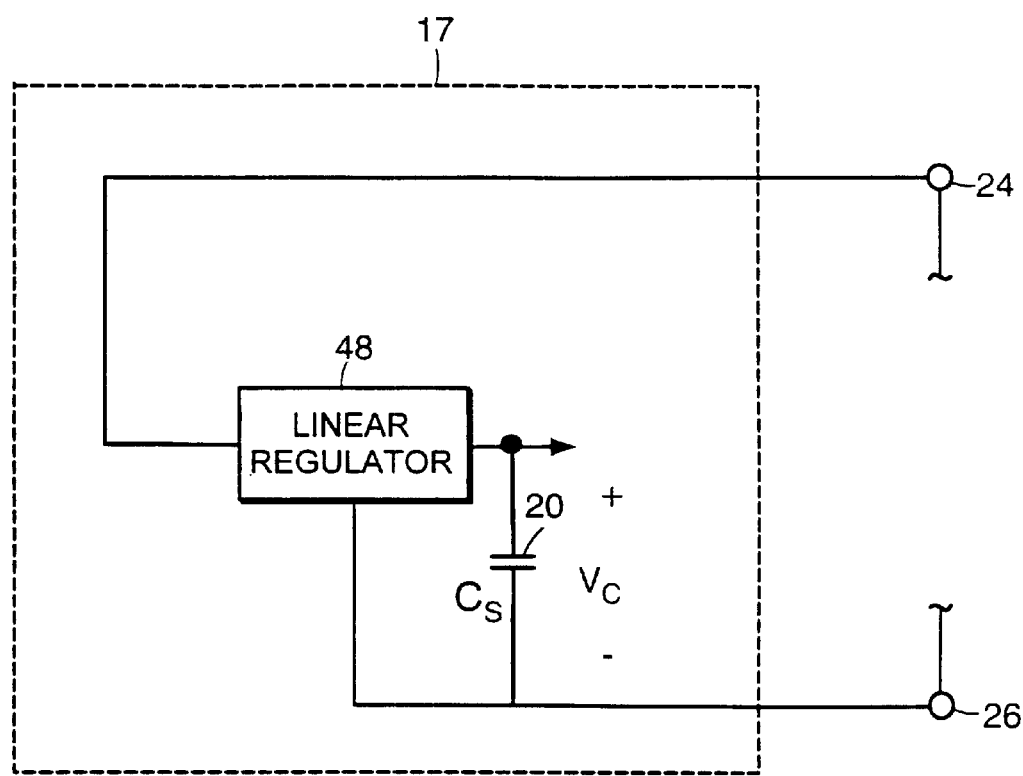

When used in a ZCS converter, control of bias voltage, $V_C$, is simplified because the smooth rise of voltages in the converter (e.g., V2(t), FIG. 7C) allow bias voltage to be controlled by opening and closing the charging switch 16 at certain voltage levels, as described above. In other kinds of converters, such as PWM converters, the rise and fall of voltages may occur much more rapidly (idealized waveforms for the PWM converter of FIG. 2 are shown in FIGS. 8A through 8D). In such converters a different technique for bias voltage generation may need to be used, the specific technique being dependent upon the range of variation of the peak value of the reverse voltage, $V_2(t)$ (FIGS. 2, 5), and the desired maximum variation in bias voltage $V_C(t)$. For example, the bias circuit 17 of FIG. 5, operating as described above for use in the ZCS converter, may be used in any power converter in which the range of variation of $V_X$ (the peak value of $V_2(t)$, FIG. 8B) is within the allowable maximum range of variation of the bias voltage $V_C(t)$. Where the range of variation of $V_X$ falls outside of the allowable maximum range of variation of the bias voltage $V_C(t)$, however, a different bias circuit 17 will be required. Alternative bias circuits are shown in FIGS. 9A, 9B and 9C. In the Figures, the bias circuits 17 are shown connected between the cathode terminal 24 and the anode terminal 26 of a two-terminal synchronous rectifier.

In FIG. 9A the bias circuit 17 is a buck PWM converter comprising charging switch 16, inductor 34, storage capacitor 20, freewheeling diode 35 and PWM controller 34. When the voltage, $V_T$, across the terminals 24, 26 of the two-terminal controller is positive, the duty cycle of the charging switch 16 is controlled by PWM controller 42, using well-known techniques, to control the voltage $V_C(t)$ within some desired range. Other kinds of switching regulators could also be used. For example, a buck-boost or boost converter could be used as the bias circuit depending on the relative ranges of $V_T$ and $V_C$.

The bias voltage $V_C$ can also be generated using a switched-capacitor voltage converter. Examples of converters of this kind, which use no inductors and which can deliver outputs which are above or below their input voltage, are described in Fette, U.S. Pat. No. 5,414,614, "Dynamically Configurable Switched Capacitor Power Supply and Method", in Cave et al, U.S. Pat. No. 5,563,779, "Method and Apparatus for a Regulated Supply On an Integrated Circuit" and in Asano, U.S. Pat. No. 4,205,369, "Voltage Chopping Circuit" all of which are incorporated by reference. Switched-capacitor voltage converters readily lend themselves to silicon integration and are manufactured as integrated circuit building blocks by Maxim integrated Products, Sunnyvale, Calif., USA, Linear Technology Corporation, Milpitas, Calif., and others. A block diagram of a switched-capacitor voltage converter for use in a two-terminal synchronous rectifier is shown in FIG. 9B. In the Figure the switched-capacitor voltage converter comprises switching and regulation circuitry 44 comprising switches, $S_1$ through $S_m$ 48a–48m; and storage capacitors, $C_1$ through $C_n$ 38a–38n. The number of switches, m, and the number of capacitors, n, will depend on the range of variation of the voltage $V_T(t)$ and the desired range of variation of Vc. In a typical application, in which the maximum and minimum values of $V_T(t)$ are within a 2.5:1 ratio, two or three capacitors might be required, with an appropriate matrix of switches 48a–48m. By active configuration of the switches, several capacitors will typically be charged in a series configuration when $V_T(t)$ is positive and reconfigured into a parallel, or series-parallel arrangement, to deliver the voltage Vc prior to $V_T(t)$ going negative. By this means the energy stored at Vc is replenished during each operating cycle.

A bias circuit 17 using linear voltage regulation can also be used to control the bias voltage Vc, as illustrated in FIG. 9C. In the Figure the voltage $V_T(t)$ is connected by the charging switch 16 to the input of a linear regulator which charges a storage capacitor 20 to a predetermined, regulated, voltage Vc.

Figure 10A:
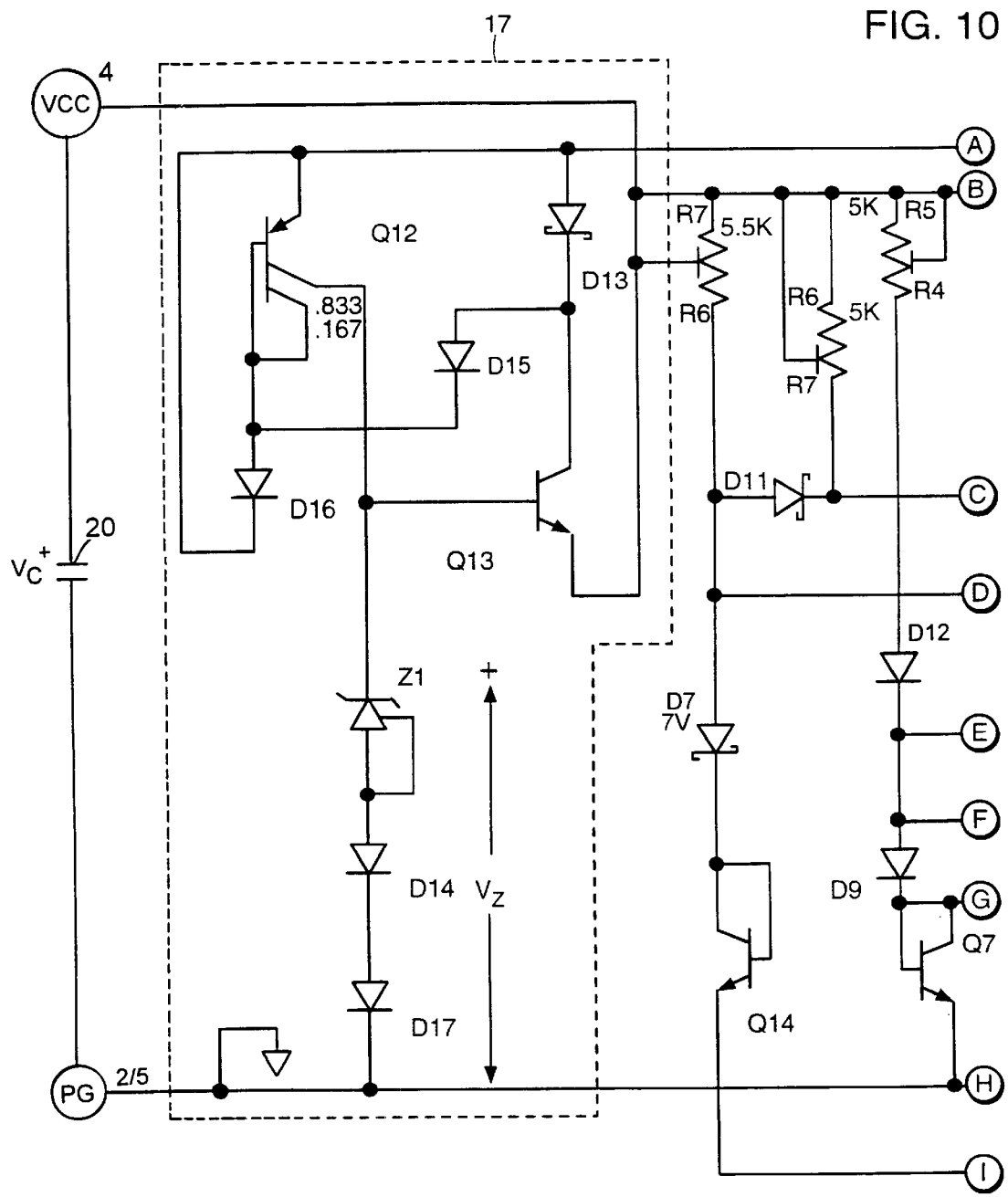
FIG. 10 is a schematic of a two-terminal synchronous rectifier according to the invention.
Figure 10B:
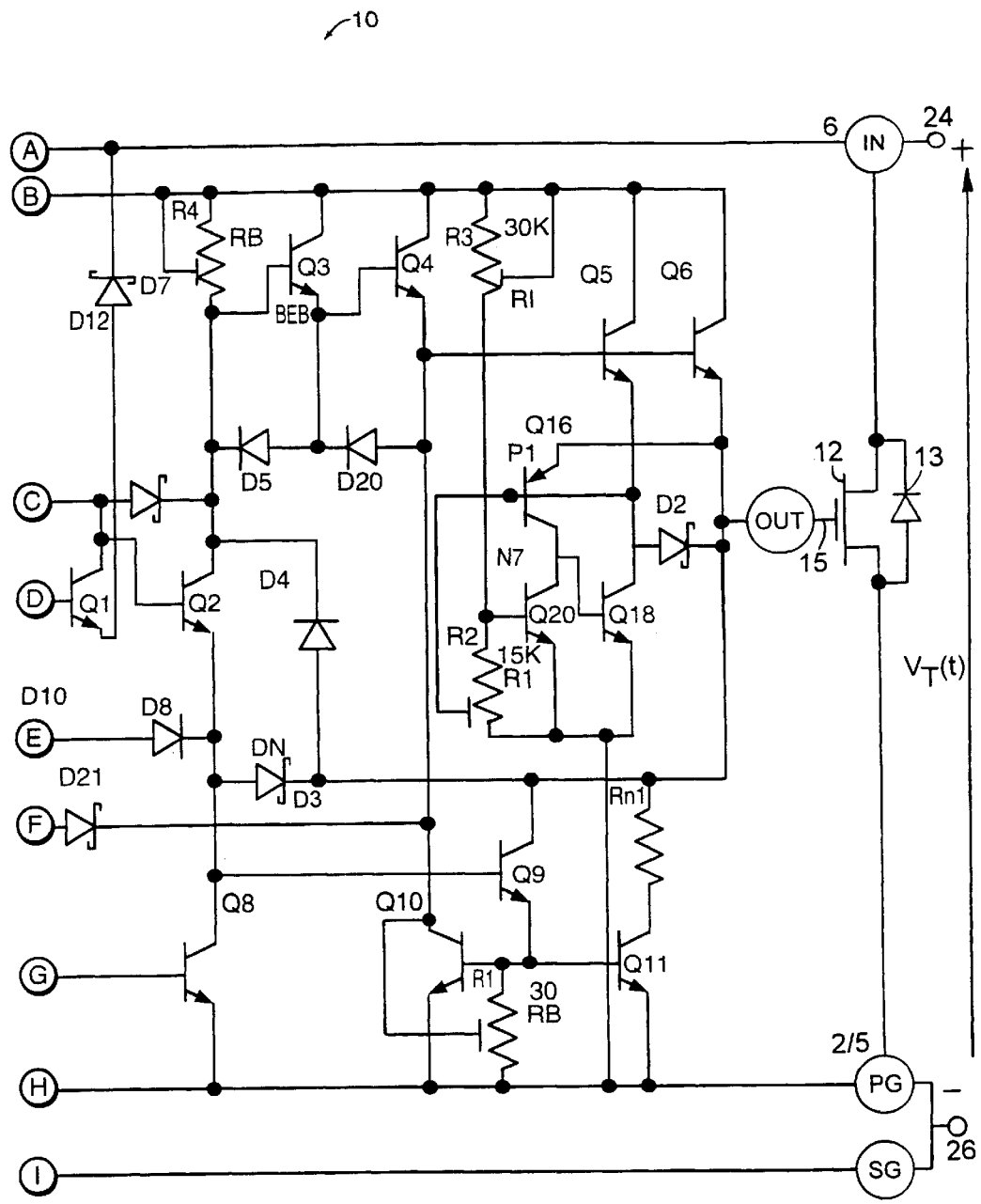

An embodiment of a two-terminal synchronous rectifier 10 of the kind shown in FIG. 5 is shown in FIG. 10.

Referring to the figure, terminals 24 and 26 are the cathode and anode, respectively, of two-terminal synchronous rectifier 10 (terminal 26 connects to a signal ground terminal (SG) and a power ground terminal (PG) which, in the discussion which follows, may be considered as electrically common points). The bias circuit 17 comprises transistors Q12 and Q13; diode D16; storage capacitor 20; and zener diode Z1. A positive voltage, $V_T(t)$, between terminal 24 and terminal 26 with a positive rate-of-change causes current to flow in the substrate capacitance formed by the epitaxial tub of Q12. This current is multiplied by Q12 and reflected into zener diode Z1, diodes D14 and D17 and the base of Q13. As $V_T(t)$ increases the storage capacitor is charged to a voltage Vc which is one diode drop above Vz. The voltage Vc powers the remainder of the circuitry.

Transistor Q1, diodes D7 and D12 and transistor Q14 form a high speed comparator which senses the voltage $V_T(t)$. As connected, the base-emitter drop of Q14 cancels the base-emitter drop of Q1 and the voltage drops in D12 and D7 also cancel. Thus, when $V_T(t)$ is positive (i.e., greater than zero volts), Q1 is off and when $V_T(t)$ is negative (i.e., less than zero volts), Q1 is off. When Q1 is on, Q2 is off, Q3 and Q4 are on, and Q5 and Q6 are on and Q9 and Q1 1 are off. Q6 connects Vc to the control input 15 of MOSFET switch 12, turning it on. By a similar analysis, when Q1 is off, Q5 and Q6 are off and Q9 and Q11 are on, holding MOSFET 12 off. Thus, when $V_T(t)$ is negative, the MOSFET 12 is on and conducts current and when $V_T(t)$ is positive, the MOSFET is off and current is blocked. As noted above, the MOSFET 12 is chosen to provide a suitable low voltage drop when turned on. The circuit comprising transistors Q16, Q18 and Q20 is a startup circuit which prevents spurious switching of switch 12 until Vc is sufficiently high. Q16 and Q18 form a latch which turns on when Vc is low, holding the control input 15 low. As Vc increases, to a predetermined level, set by resistors R2 and R3, Q20 turns on disabling the Q16/Q18 latch and allowing the control signal 15 to rise.

Referring to FIG. 10, the MOSFET 12, the storage capacitor 20, the diode 13, the bias circuit 17 and terminals 24, 26 correspond to elements having the same reference numbers in FIG. 5. Switches Q5 and Q6 in FIG. 10 correspond to activation switch 18 in FIG. 5; Switches Q9 and Q11 in FIG. 10 correspond to discharge switch 14 in FIG. 5. The balance of the circuitry in FIG. 10 corresponds to the switch controller in FIG. 5.

The circuit of FIG. 10 (with the exception of the storage capacitor 20, the MOSFET 12 and diode 13) is built by Cherry Semiconductor Corporation, East Greenwich, Rhode Island, USA, using a high speed bipolar process. If configured to deliver Vc=7 Volts, and combined with a low on-resistance MOSFET (e.g., an FDP6670AL N-channel MOSFET manufactured by Fairchild Semiconductor Corporation, South Portland, Me., USA, having a nominal on-resistance of a few milliohms), the circuit of FIG. 10 drives the MOSFET gate with rise and fall times of approximately 10 nanoseconds. The high speed performance of the two-terminal synchronous rectifier circuit (the rise and fall times being analogous to the forward and reverse recovery times of an ordinary two-terminal rectifier) enables it to be used in power conversion applications at relatively high frequencies (e.g., in DC—DC converters operating at frequencies up to and above 1 MHz).

Figure 11A:
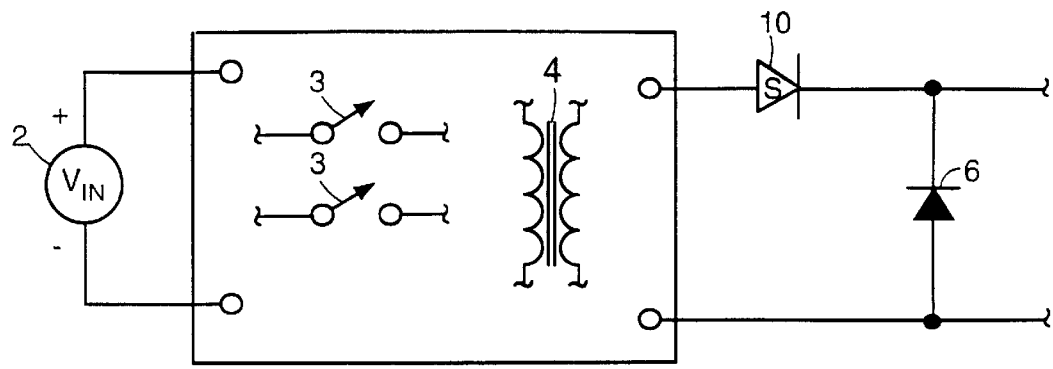
FIGS. 11A–11C show power converters comprising two-terminal synchronous rectifiers according to the invention.
Figure 11B:
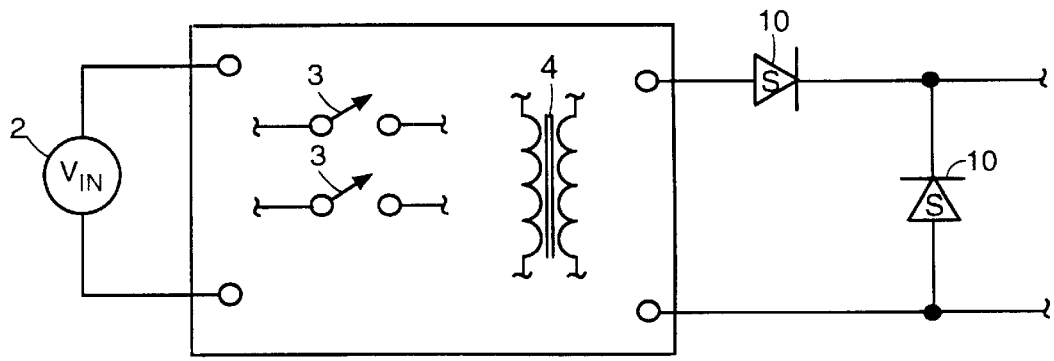
Figure 11C:
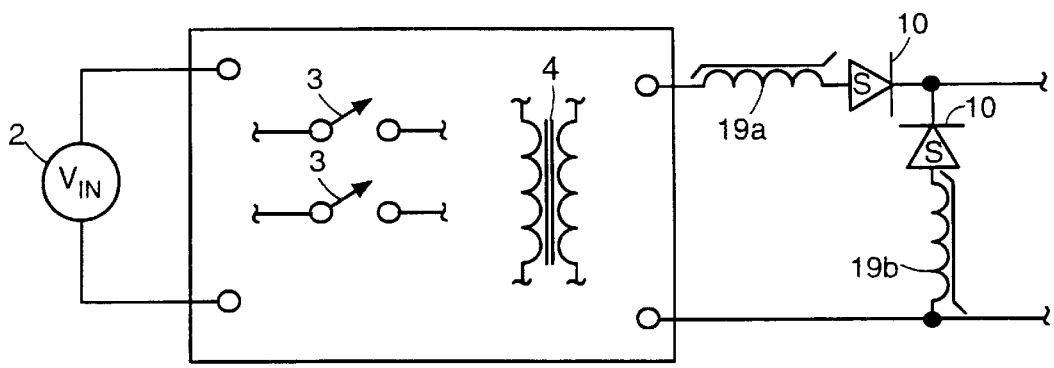

Although the two-terminal synchronous rectifier 10 according to the invention was described above (FIG. 6) in application as a replacement for a freewheeling diode, it can also be used as a replacement for a forward rectifier, as shown in FIG. 11A, or as a replacement for both the forward and the freewheeling rectifier, as shown in FIG. 11B, or for general application as an efficient rectifier replacement device in power circuitry. In applications in which switching speeds are such that conduction overlap occurs between the switches, saturable inductors 19a, 19b may, as shown in FIG. 11C, be placed in series with the switches (see, e.g., Yamashita, U.S. Pat. No. 5,726,869, "Synchronous Rectifier Type DC—DC Converter in Which a Saturable Inductive Device is Connected in Series With a Secondary-Side Switching Device", incorporated by reference).

In fixed frequency converters, or in converters with limited variation in operating frequency, the power associated with charging and discharging the gate of a synchronous rectifier MOSFET (e.g., 12 FIGS. 5 or 10) will represent an increasing fraction of the total power dissipated in the converter as the load on the converter decreases. In certain applications, such as battery powered devices, it is very desirable to maximize conversion efficiency at all values of load, as any unnecessary loss represents a degradation in useful battery life.

Figure 12:
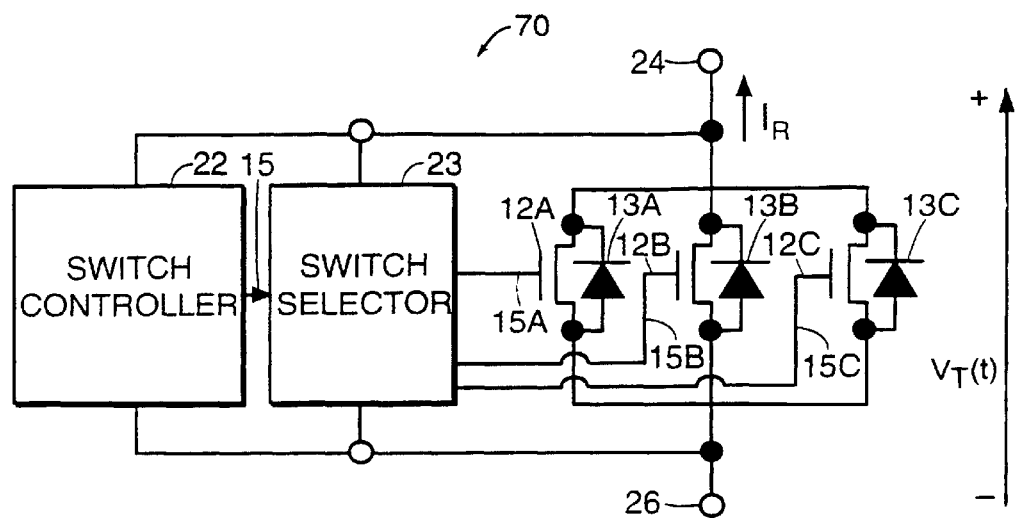
FIG. 12 shows another two-terminal synchronous rectifier according to the invention.

One way to reduce gate drive losses in synchronous rectification is shown in FIG. 12. In FIG. 12 the synchronous rectifier 70 comprises a switch controller 22, a switch selector 23 and three voltage-controlled switches 12A,12B, 12C. Also shown are three diodes 13A,13B,13C which may be the intrinsic diodes of the voltage-controlled switches. The switch controller operates as described above, generating a control signal 15 for turning on a voltage controlled switch when the voltage $V_T(t)$ is negative and generating a control signal 15 for disabling a voltage controlled switch when the voltage $V_T(t)$ is positive. The switch selector 23 routes the control signal 15 to one or more of the voltage control inputs 15A,15B,15C of the switches 12A,12B,12C based upon the peak negative value of $V_T(t)$. Assume, for example, that the current $I_R$ carried by the synchronous rectifier 70 is relatively low and that switch 12A is enabled. As the current increases, the peak negative value of $V_T(t)$ will also increase, owing to the on-resistance of the switch. When the peak negative value of $V_T(t)$ exceeds some pre-determined value, the switch selector will route the control signal 15 to another switch, e.g. to control input 15B of switch 12B, in addition to routing it to switch 12A. This will reduce the aggregate on-resistance and reduce the peak negative value of $V_T(t)$. It will also increase the total capacitance which must be driven by the control signal 15 (e.g., if switches 12A and 12B are identical, the capacitance will double). Likewise, as the load is further increased and the peak negative value of $V_T(t)$ once again exceeds some predetermined threshold, the third switch 12C will also be enabled, further reducing the aggregate on-resistance but further increasing the aggregate input capacitance of the switches. By this means, the total power associating with the charging and discharging of the control inputs 15A,15B,15C will decrease as load decreases, and vice versa. Although three switches are shown in the Figure, any number of switches can be used. Furthermore, the switches can be of different die sizes depending on the desired loss and aggregate control power characteristics. Disabling switches in a synchronous rectifier as current decreases is described in Rozman, U.S. Pat. No. 6,002,597.

Figure 13:
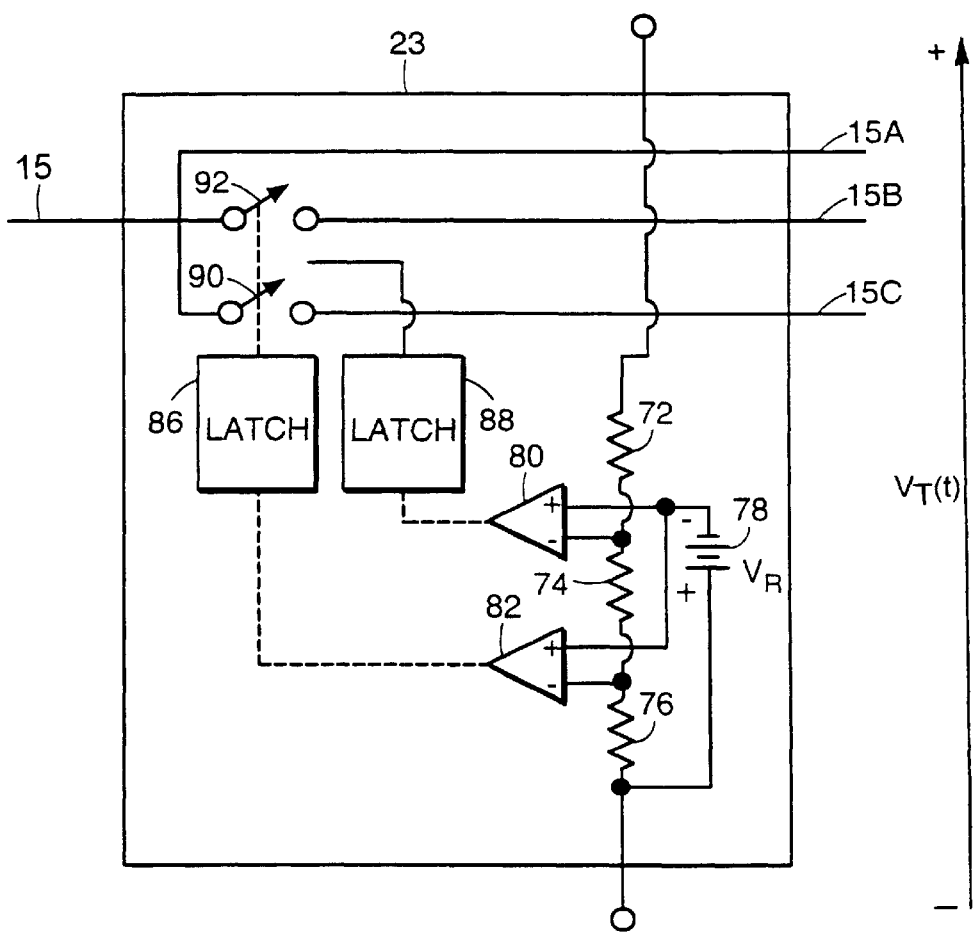
FIG. 13 shows a switch selector circuit.

FIG. 13 shows a switch selector 23 for use in the synchronous rectifier 70 of FIG. 12. In FIG. 13, the selector consists of comparators 80,82; a resistive divider comprising resistors 72,74,76; a voltage reference 78; enabling switches 90,92; and switch control latches 86,88. During each operating cycle the comparators compare a different fraction of the voltage $V_T(t)$, determined by relative values of the resistors 72,74,76, to the voltage reference 78. As the input of a comparator 80,82 goes more negative than the voltage of the negative reference 78, its output will set the respective switch control latch 86,88 which will turn on the respective enabling switch 90,92. Comparator 82 will enable switch 90 via latch 86 at a more negative voltage than that will comparator 80. The latches are reset whenever the voltage $V_T(t)$ goes positive. By this means, the selector never drives more control gates 15A,15B,15C than are absolutely necessary. Other control strategies are possible: e.g., the latches may be set based on a measurement in a previous cycle and only be reset in the next cycle if the peak negative voltage has declined.

Figure 14:
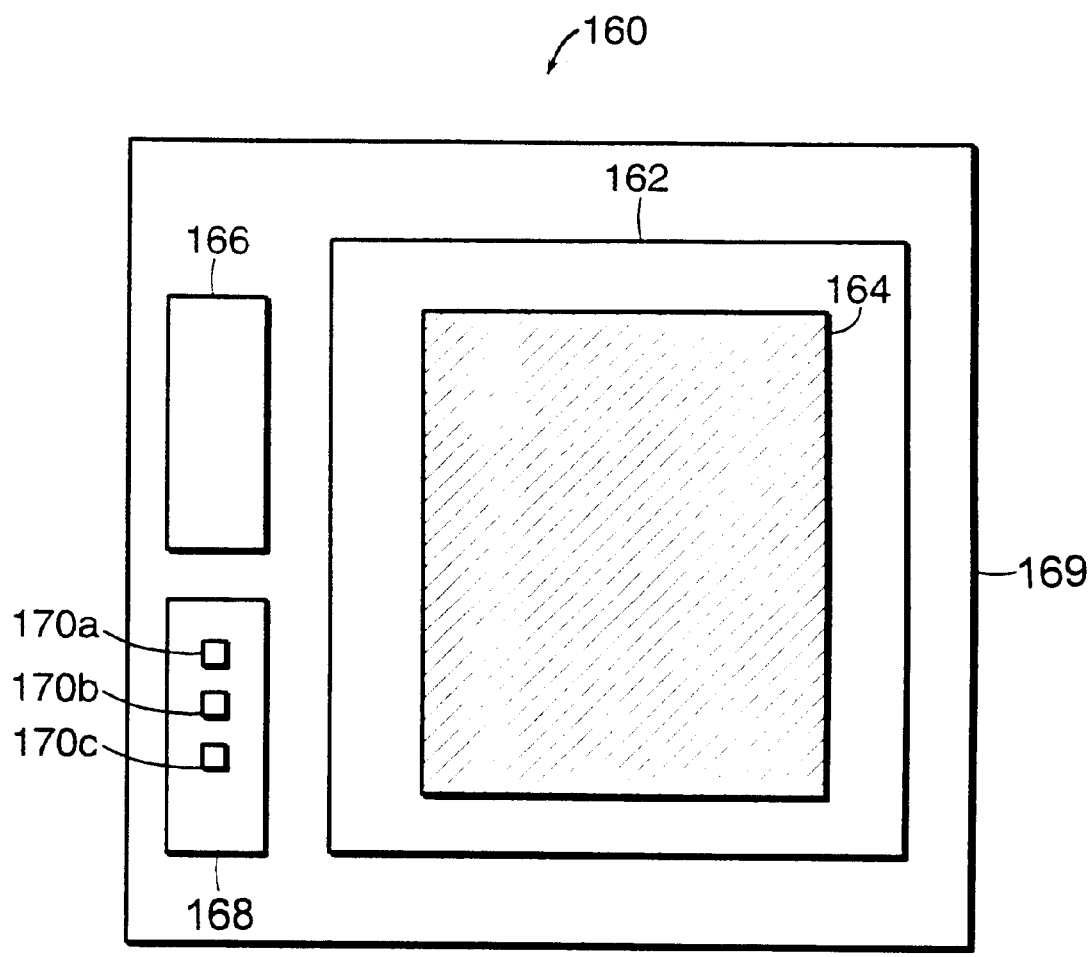
FIG. 14 shows a top view of a semiconductor die.

Because MOSFET power technology and CMOS small-signal circuit technology are compatible in terms of their semiconductor processing, and because CMOS technology is suited to integration of switch control circuitry (and switch selector circuitry if used) and bias circuitry, all of the semiconductor electronics for a two-terminal synchronous switch according to the invention can be integrated onto a single semiconductor device, as illustrated in FIG. 14. In the Figure, which shows the top side of an integrated two-terminal synchronous switch die 160, a power MOSFET 162 is integrated onto a portion of a semiconductor die 168 and switch control circuitry 166 and bias circuitry 168 are integrated onto nearby areas of the same die. The MOSFET 162, switch control circuitry 166 and bias circuitry 168 are interconnected by means of metallized conductors on the surface of the die (not shown). The anode connection 164 and cathode connection (on the bottom surface of the die, not shown) are made by means of conductive pads (e.g., anode pad 164). Bonding pads for connection to external storage capacitors 170a, 170b, 170c (if needed) may also be provided. Silicon integration improves performance by reducing parasitic inductances between the control and power switching elements.

Figure 15A:
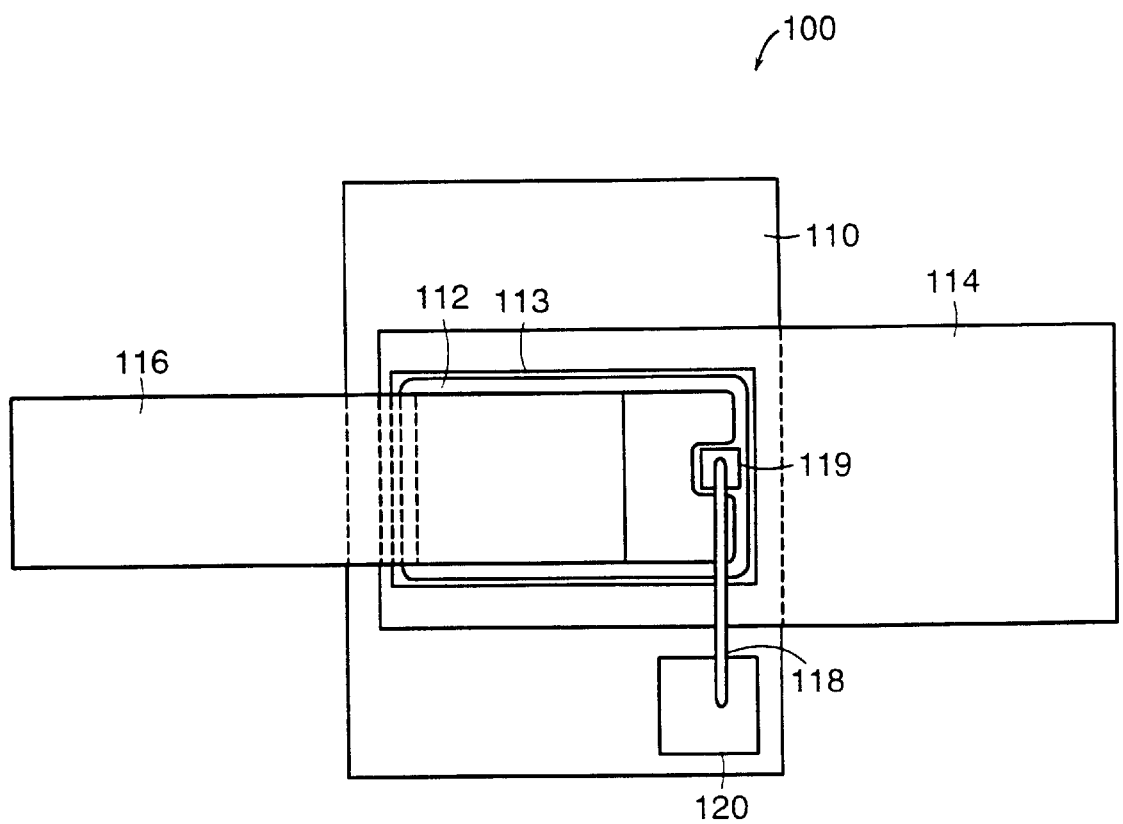
FIGS. 15A–15G show packages for a two-terminal synchronous rectifier according to the invention.
Figure 15B:
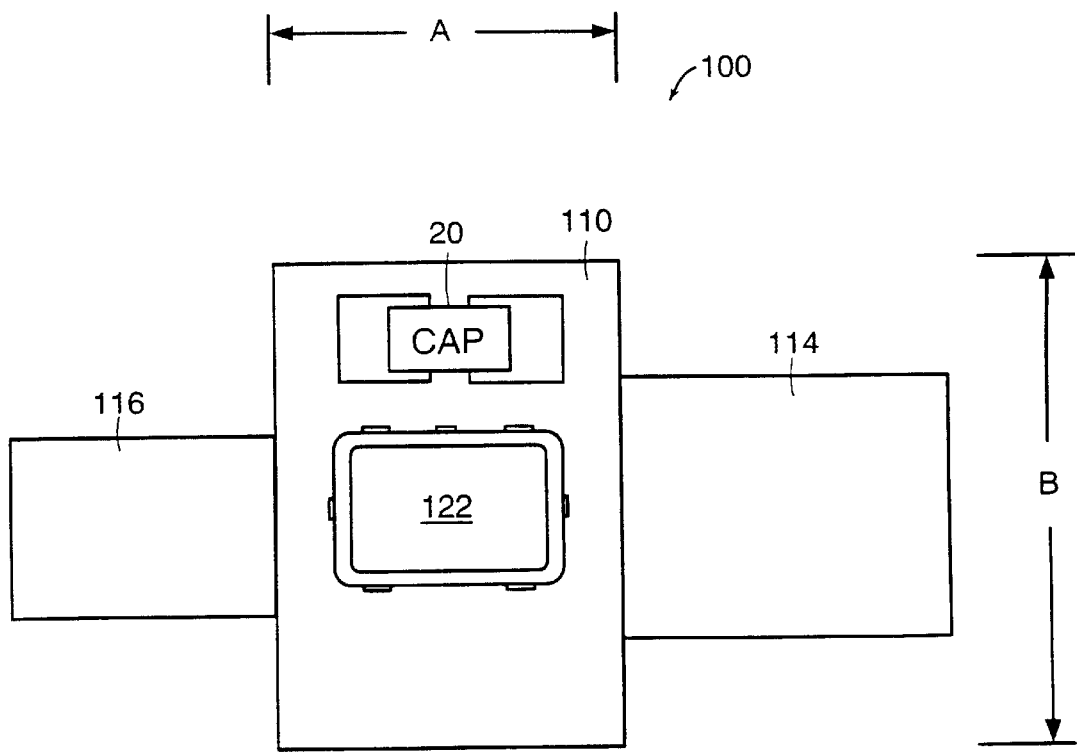
Figure 15C:
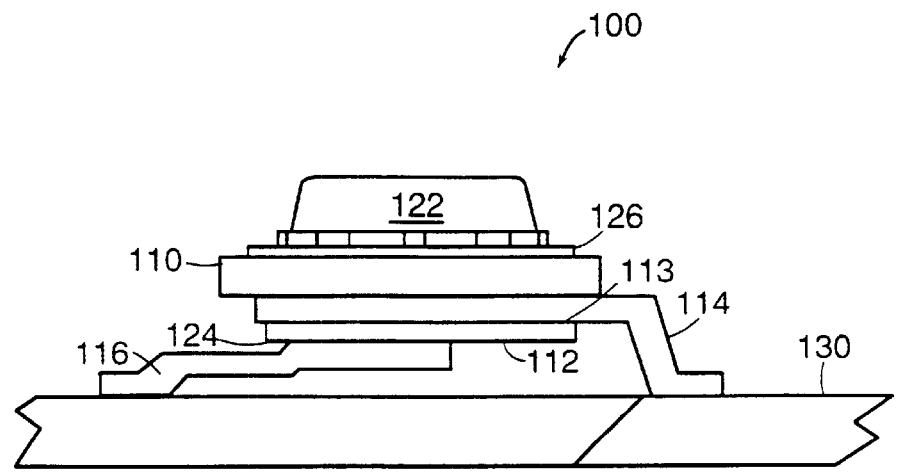

A package 100 for a two-terminal synchronous rectifier is shown in FIGS. 15A, 15B and 15C. As shown in FIG. 15B the switch control and bias circuitry (and switch selector circuitry if used) are included in integrated circuit package 122 which, along with surface-mount storage capacitor 20, is mounted on one side of a substrate 110. The substrate may be made of alumina ceramic or FR-4 printed circuit board composite. On the reverse side of the substrate (FIGS. 15A and 15C) a current-carrying termination on the back side of a MOSFET die 112 is connected (by use of a conductive medium 113, e.g., solder or conductive adhesive) to a conductive lead 114. As illustrated in the Figures, the conductive lead is connected to the surface of the substrate 110 (e.g., by direct bonding or by connecting to a pad deposited on the surface of the substrate by means of solder or adhesive). A conductive strap 116 is connected to another current-carrying termination on the other side of the MOSFET die (by use of a conductive medium 124, e.g., solder or conductive adhesive). A gate control pad 119 on the MOSFET is connected by wire bond 118 to a pad 120 on the surface of the substrate 110. Plated through holes in, and conductive etches on the surfaces of, (not shown) the substrate 110 connect the integrated circuit package 122 to the storage capacitor 20 and the MOSFET die 112. The conductive lead 114 and conductive strap 116 form the two terminals of the two-terminal synchronous rectifier. The conductive lead and conductive strap are shown flat in FIGS. 15A and 15B and shown formed in FIG. 15C (to allow connecting the package 100 to conductive etches on another substrate (e.g., printed circuit board 130)).

Figure 15D:
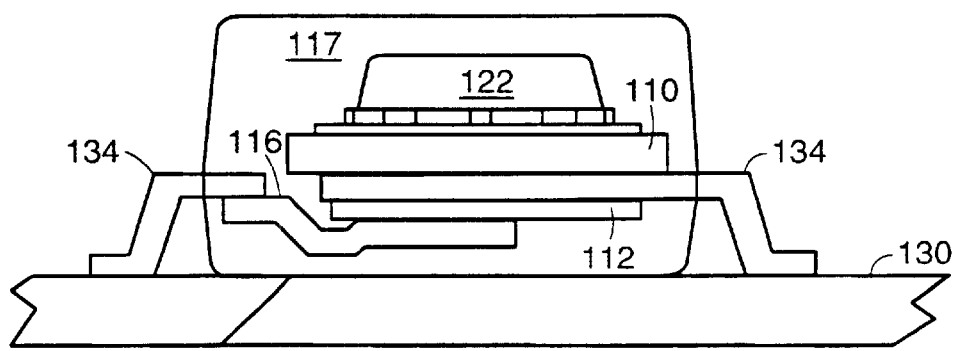
Figure 15E:
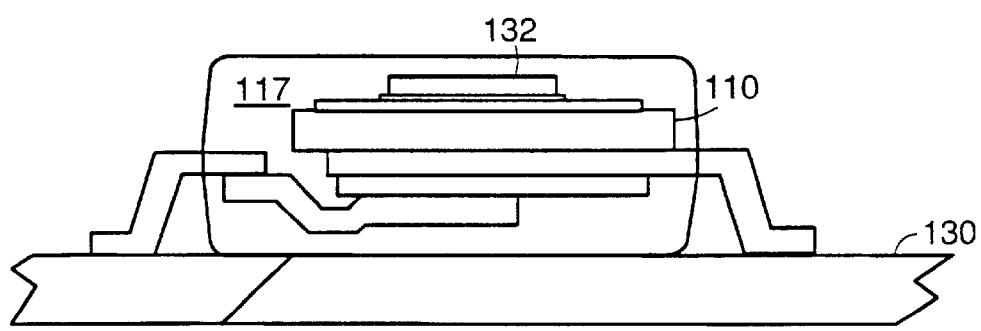
Figure 15F:
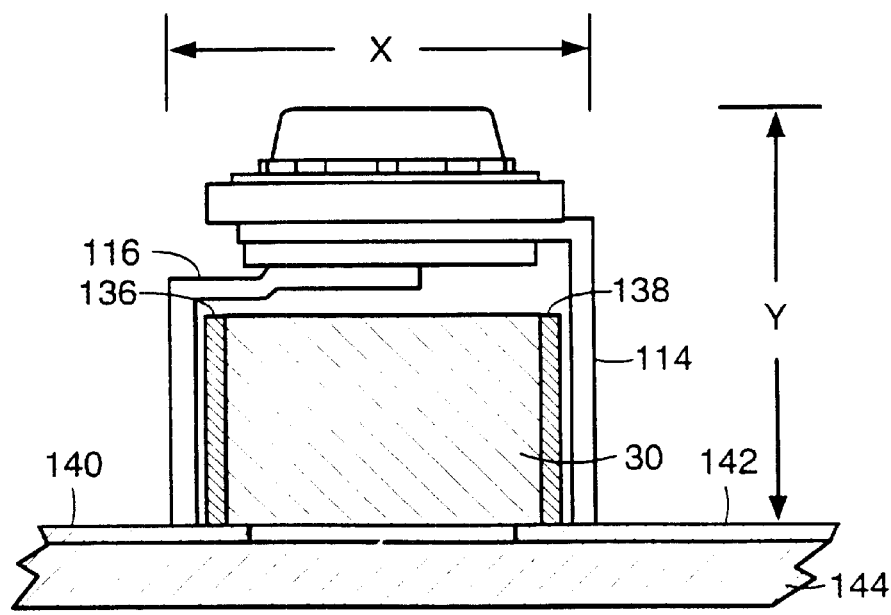

Alternate package arrangement are shown in FIGS. 15D, 15E and 15F. In FIG. 15D the conductive lead comprises a leadframe assembly 134 and the conductive strap 116 is connected to a portion of the leadframe 134. The assembly comprising the leadframe 134, conductive strap 116, the MOSFET 112, the integrated circuit package 122 and the storage capacitor 20 (not visible in the view) are encapsulated in molding material 117 (e.g., epoxy, silicone). In the molded assembly of FIG. 15E the integrated circuit package is replaced with an integrated circuit die 132 containing the switch control and bias circuitry (and switch selector circuitry if used). Connection pads on the die are connected to the substrate 110 using known methods.

Figure 15G:
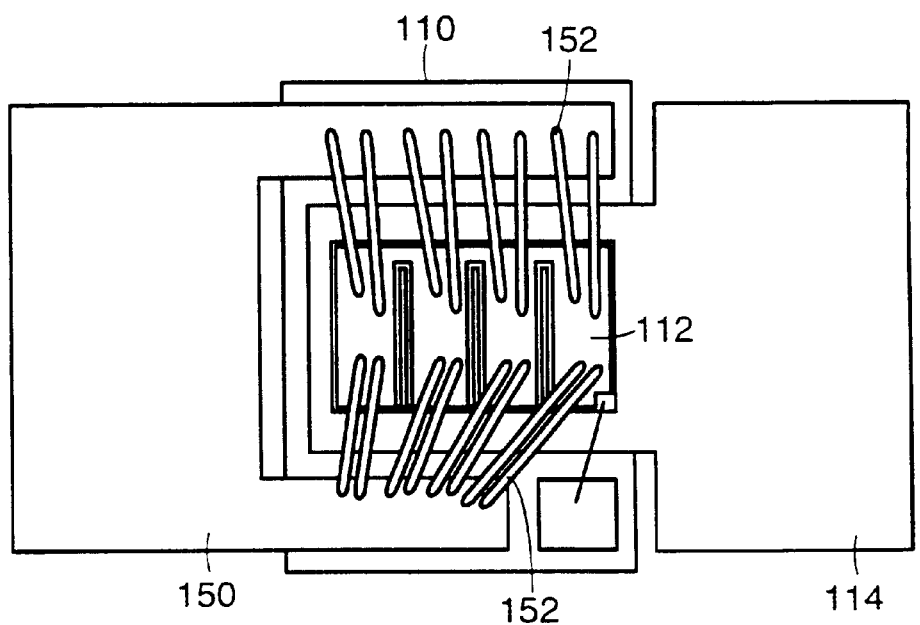

Any of the packages of FIGS. 15A through 15F may be modified, as shown in FIG. 15G, to use a wire bonding of the MOSFET to the a strap. Instead of connecting a conductive strap 116 to the current-carrying termination on the surface of the MOSFET die (e.g. as shown in FIGS. 15A and 15C), the MOSFET die is connected by bond wires (e.g., bond wires 152) to a bonding strap 150. The bonding strap 150 lies on the surface of the substrate 10, in the same plane as the conductive lead 114.

Any of the packages of FIGS. 15A through 15G may be modified by replacing the MOSFET die 112 with an integrated two-terminal synchronous switch die (160, FIG. 14), thereby eliminating the need for a separate integrated circuit package 122.

The package of FIG. 15F is particularly useful in power converters in which the two-terminal synchronous rectifier is connected directly across another component. For example, the freewheeling diode in a zero-current switching converter is connected across a capacitor 30, as illustrated in FIG. 6. In FIG. 15F the conductive lead and strap 114, 116 are folded down and the entire two-terminal synchronous rectifier assembly is mounted directly over a capacitor 30. After mounting, solder connections are made simultaneously between the lead and strap 114, 116, the capacitor terminations 136,138 and conductive etches 140,142 on the printed circuit board 144.

The packages shown in FIGS. 15A through 15F minimize inductances in the interconnects within the two-terminal synchronous rectifier (i.e., between the integrated circuit package 122, the capacitor 20 and the MOSFET 112), thereby minimizing ringing within the synchronous rectifier circuit and improving switching speeds. Mounting the packaged synchronous rectifier directly onto the leads of a component, as shown in FIG. 15F, minimizes lead length and stray inductance between the synchronous rectifier and the capacitor 30, thereby optimizing synchronous rectifier performance in high frequency power converters, including ZCS converters and others.

Dimensions A and B in FIG. 15B are approximately 0.180 inch and 0.260 inch, respectively; dimensions X and Y of the package of FIG. 15F are approximately 0.234 inch and 0,165 inch, respectively.

Other embodiments are within the scope of the following claims. For example, the voltage controlled switches could be gallium arsenide field-effect transistors; the circuits and methods could be adapted to use current controlled switches, such as bipolar transistors; the controllers could be analog or digital or some combination thereof; the steady-state timing of the transitions of the voltage-controlled switch(es) could be adjusted by use of a "servo" technique, as taught in Vinciarelli, U.S. Pat. No. 5,659,460 (incorporated by reference).

What is claimed is:

1. A switching circuit having
at least two terminals, the at least two terminals including two current control terminals for connection at two locations in another circuit,
an active switch, and
a controller configured to sense circuit conditions from between the two locations and configured to turn the active switch off to block current between the two locations when the voltage between the two locations is of a first polarity and to turn the active switch on to conduct current between the two locations when the voltage between the two locations is not of the first polarity, whether or not the two current control terminals are the only ones of the at least two terminals that are connected to the other circuit.

2. The circuit of claim 1 in which the at least two terminals comprise exactly two terminals.

3. The circuit of claim 1 in which the active switch comprises an active switch in parallel with a diode.

4. The circuit of claim 1 in which the active switch comprises a MOSFET.

5. The circuit of claim 1 further comprising a bias subcircuit connected between the two current control terminals and configured to use power from the other circuit to provide operating power to the switching circuit.

6. The circuit of claim 5 in which the bias subcircuit includes a capacitor, a switch, and a bias voltage controller for the switch.

7. The circuit of claim 1 in which the other circuit comprises a power converter.

8. The circuit of claim 1 in which the controller is configured to sense a polarity of the voltage between the two locations and to turn the active switch on and off in response to the sensed polarity.

9. A method comprising
sensing circuit conditions from between two locations in a circuit and
turning an active switch off to block current between the two locations when the voltage between the two locations is of a first polarity and to turn the active switch on to conduct current between the two locations when the voltage between the two locations is not of the first polarity, without regard to voltages or currents at any other locations in the circuit.

10. The method of claim 9 wherein
the sensing comprises sensing a polarity of the voltage between the two locations; and
the active switch is turned on and off in response to the sensed polarity.

11. The method of claim 9 further comprising:
drawing power from between the two terminals to use for turning the active switch on and off.

12. The method of claim 11 further comprising:
providing a bias subcircuit having a capacitor, a switch, and a bias voltage controller for the switch to draw power from between the two terminals and to turn the active switch on and off.

13. The method of claim 9 further comprising:
using the active switch to provide a low resistance path for current flow between the two terminals when on.

14. The method of claim 11 further comprising:
providing an electronic device having two terminals for connection to the two locations, the electronic device including the active switch and being adapted to perform the sensing, drawing power, and turning on and off.

15. A method comprising:

providing an active rectifier having (i) a first and a second terminal, (ii) an active switch connected to carry current between the first and second terminals in a first direction when on and to block current in the first direction when off, and (ii) a control circuit adapted to be powered from the first and second terminals, to sense conditions between the first and second terminals, and to turn the active switch off when the voltage between the first and second terminals is of a first polarity and to turn the active switch on when the voltage between the first and second terminals is not of the first polarity.

16. The method of claim 15 further comprising connecting the first and second terminals of the active rectifier to the circuit.

17. The method of claim 16 further comprising using the active rectifier as a rectifier in the circuit.

UNITED STATES PATENT AND TRADEMARK OFFICE
CERTIFICATE OF CORRECTION

PATENT NO.    : 6,421,262 B1  Page 1 of 1
DATED         : July 16, 2002
INVENTOR(S)   : John R. Saxelby, Jr. et al.

It is certified that error appears in the above-identified patent and that said Letters Patent is hereby corrected as shown below:

Column 8,
Line 23, change "Q1 1" to -- Q11 --.

Column 10,
Line 25, change "168" to -- 169 --.

Column 11,
Line 16, delete "the" before "a strap".
Line 15, change "use a wire bonding" to -- use wire bonding --.

Column 13,
Line 6, change "(ii)" to -- (iii) --.

Signed and Sealed this

Eighth Day of April, 2003

JAMES E. ROGAN
*Director of the United States Patent and Trademark Office*